United States Patent
Kalifa et al.

(10) Patent No.: US 11,165,222 B2
(45) Date of Patent: Nov. 2, 2021

(54) OPTICALLY MATCHED VERTICAL-CAVITY SURFACE-EMITTING LASER (VCSEL) WITH PASSIVATION

(71) Applicant: Mellanox Technologies, Ltd., Yokneam (IL)

(72) Inventors: Itshak Kalifa, Ramat Gan (IL); Elad Mentovich, Tel Aviv (IL)

(73) Assignee: Mellanox Technologies, Ltd., Yokneam (IL)

( * ) Notice: Subject to any disclaimer, the term of this patent is extended or adjusted under 35 U.S.C. 154(b) by 0 days.

(21) Appl. No.: 16/404,244

(22) Filed: May 6, 2019

(65) Prior Publication Data

US 2020/0358247 A1    Nov. 12, 2020

(51) Int. Cl.
| | | |
|---|---|---|
| *H01S 5/00* | (2006.01) | |
| *H01S 5/028* | (2006.01) | |
| *H01S 5/183* | (2006.01) | |
| *H01S 5/02257* | (2021.01) | |

(52) U.S. Cl.
CPC ........ *H01S 5/0282* (2013.01); *H01S 5/02257* (2021.01); *H01S 5/18344* (2013.01); *H01S 5/18347* (2013.01); *H01S 5/18394* (2013.01)

(58) Field of Classification Search
CPC ............... H01S 5/0282; H01S 5/02296; H01S 5/18344; H01S 5/183; H01S 5/18308; H01S 5/3095; H01S 5/18347; H01S 5/18327; H01S 5/18394; H01S 5/18–18397

See application file for complete search history.

(56) References Cited

U.S. PATENT DOCUMENTS

| | | |
|---|---|---|
| 5,963,576 A | 10/1999 | Claisse et al. |
| 6,084,900 A | 7/2000 | Claisse et al. |
| 6,661,823 B1 * | 12/2003 | Otoma ............... H01S 5/18391 |
| | | 372/49.01 |
| 7,483,465 B2 | 1/2009 | Thornton et al. |
| 8,189,642 B1 | 5/2012 | Li et al. |

(Continued)

OTHER PUBLICATIONS

Yue Shi et al. "A Review: Preparation, performance and applications of Silicon Oxynitride Film" Micromachines 2019, 10, 552, pp. 1-23 (Year: 2019).*

(Continued)

*Primary Examiner* — Minsun O Harvey
*Assistant Examiner* — Delma R Fordé
(74) *Attorney, Agent, or Firm* — Alston & Bird LLP

(57) ABSTRACT

A vertical-cavity surface-emitting laser (VCSEL) is provided. The VCSEL includes a mesa structure disposed on a substrate. The mesa structure has a first reflector, a second reflector, and an active cavity material structure disposed between the first and second reflectors. The mesa structure defines an optical window through which the VCSEL is configured to emit light. The mesa structure further includes a passivation layer disposed at least within the optical window. The passivation layer is designed to seal the mesa structure to reduce the humidity sensitivity of the VCSEL and to protect the VCSEL from contaminants. The passivation layer also provides an improvement in overshoot control, broader modulation bandwidth, and faster pulsing of the VCSEL such that the VCSEL may provide a high speed, high bandwidth signal with controlled overshoot and dumping behavior.

20 Claims, 2 Drawing Sheets

(56) References Cited

U.S. PATENT DOCUMENTS

Figure 1:
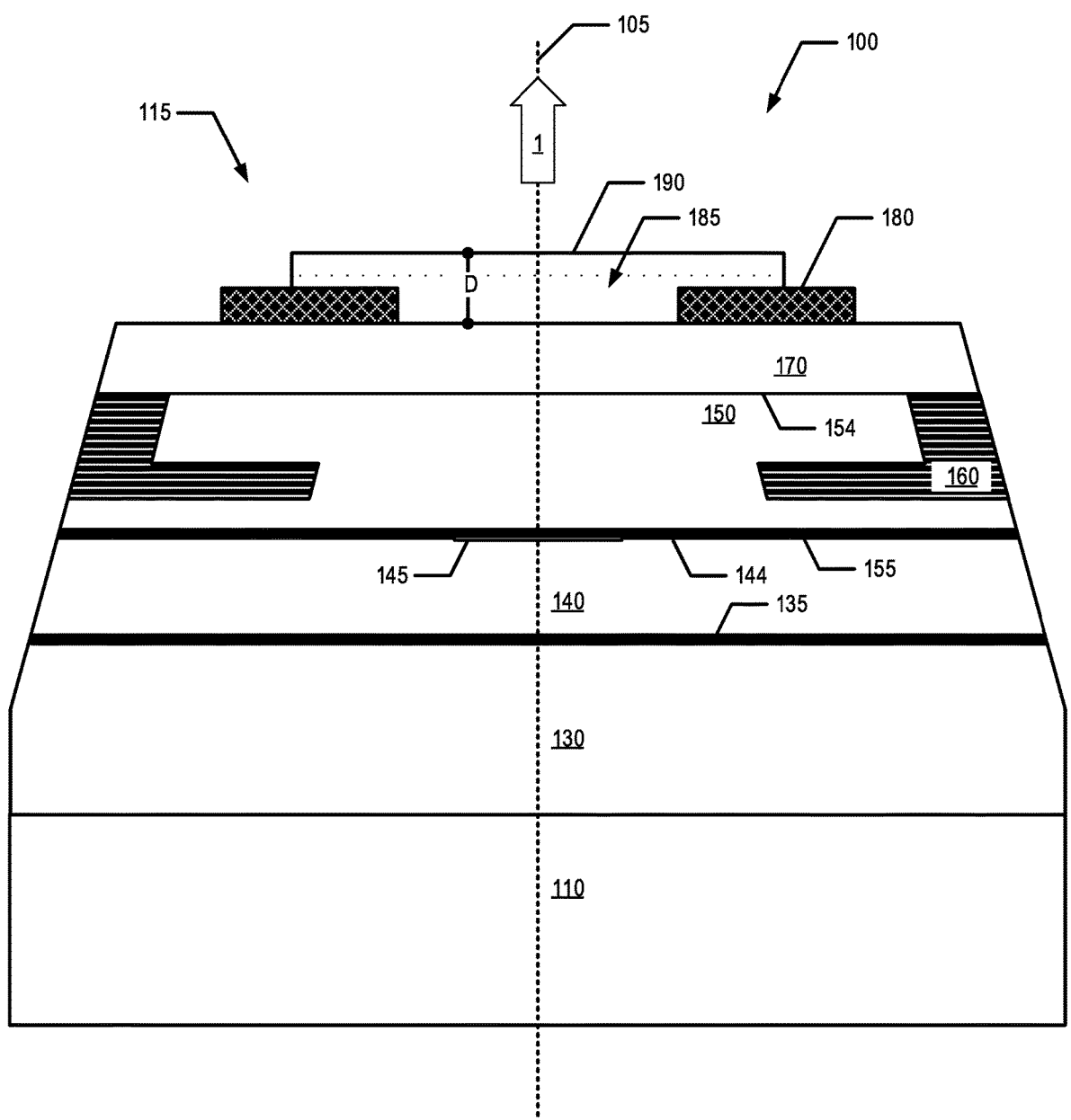

| | | | |
|---|---|---|---|
| 8,971,372 B2* | 3/2015 | Suzuki | H01S 5/4087 372/50.124 |
| 9,716,368 B2 | 7/2017 | Padullaparthi | |
| 10,199,794 B1* | 2/2019 | Yuen | H01S 5/0218 |
| 2002/0003822 A1* | 1/2002 | Wipiejewski | H01S 5/18311 372/45.01 |
| 2002/0101894 A1 | 8/2002 | Coldren et al. | |
| 2002/0172247 A1* | 11/2002 | Sopra | H01S 5/18355 372/46.011 |
| 2004/0151221 A1* | 8/2004 | Yamamoto | B82Y 20/00 372/32 |
| 2005/0030993 A1 | 2/2005 | Thornton et al. | |
| 2007/0217472 A1 | 9/2007 | Collins et al. | |
| 2007/0268943 A1 | 11/2007 | Tatum | |
| 2008/0069168 A1 | 3/2008 | Kim et al. | |
| 2008/0137692 A1 | 6/2008 | Park et al. | |
| 2008/0205465 A1 | 8/2008 | Nguyen et al. | |
| 2009/0274186 A1* | 11/2009 | Mochizuki | H01S 5/18388 372/43.01 |
| 2010/0040104 A1* | 2/2010 | Maeda | H01S 5/02461 372/50.124 |
| 2011/0135318 A1* | 6/2011 | Takeda | H01S 5/18311 398/182 |
| 2011/0150500 A1* | 6/2011 | Matsushita | H01S 5/18313 398/182 |
| 2011/0165712 A1* | 7/2011 | Uchida | H01S 5/18344 438/34 |
| 2013/0051421 A1* | 2/2013 | Traut | H01S 5/0282 372/49.01 |
| 2014/0064315 A1* | 3/2014 | Dummer | H01S 5/0261 372/50.124 |
| 2015/0078410 A1 | 3/2015 | Padullaparthi | |
| 2015/0380606 A1* | 12/2015 | Padullaparthi | H01L 33/20 257/99 |
| 2015/0380901 A1 | 12/2015 | Brenner et al. | |
| 2016/0064900 A1* | 3/2016 | Takeda | H01S 5/18311 438/29 |
| 2016/0118773 A1* | 4/2016 | Hayakawa | H01S 5/2202 372/45.01 |
| 2016/0226221 A1 | 8/2016 | Kaneko | |
| 2016/0352074 A1* | 12/2016 | Hogan | H01S 5/18388 |
| 2017/0005455 A1* | 1/2017 | Padullaparthi | H01S 5/18391 |
| 2017/0256915 A1 | 9/2017 | Ghosh et al. | |
| 2018/0331491 A1* | 11/2018 | Tsuji | H01S 5/4068 |
| 2018/0341076 A1 | 11/2018 | Watanabe et al. | |
| 2019/0067899 A1* | 2/2019 | Tsuji | H01J 37/00 |
| 2019/0067906 A1* | 2/2019 | Yuen | G02B 27/2242 |
| 2019/0312413 A1* | 10/2019 | Sirbu | H01S 5/18355 |
| 2020/0106242 A1 | 4/2020 | Kalifa et al. | |
| 2020/0358247 A1 | 11/2020 | Kalifa et al. | |

OTHER PUBLICATIONS

Backer, A. et al.; "Transverse Optical Mode Analysis of Long-Wavelength VCSEL in High Single-Mode Operation"; Proc. Of 8th Int. Conf. of Numerical Simulation of Optoelectronic Devices (NUSOD); pp. 87-88; 2008.

Caliman, A. et al.; "25 Gbps Direct Modulation and 10 km Data Transmission with 1310 nm Waveband Wafer Fused VCSELs"; Optics Express; vol. 24, No. 15; Jul. 25, 2016; pp. 16329-16335.

Feezell, D. et al.; "InP-Based 1.3-1.6 µm VCSELs With Selectively Etched Tunnel-Junction Apertures on a Wavelength Flexible Platform"; IEEE Photonics Technology Letters; vol. 17, No. 10; Oct. 2005; pp. 2017-2019.

Kapon, Eli et al.; "Power-Efficient Answer"; Nature Photonics; vol. 3; Jan. 2009; pp. 27-29.

Lin, Chao-Kun et al.; "High Temperature Continuous-Wave Operation of 1.3- and 1.55-µm VCSELs With InP/Air-Gap DBRs"; IEEE Journal of Selected Topics in Quantum Electronics; vol. 9, No. 5; Sep./Oct. 2003; pp. 1415-1421.

Sirbu, Alexei et al.; "Reliability of 1310 nm Wafer Fused VCSELs"; IEEE Photonics Technology Letters; vol. 25, No. 16; Aug. 15, 2013; pp. 1555-1558.

Sirbu, Alexei et al.; "Wafer-Fused Heterostructures: Application to Vertical Cavity Surface-Emitting Lasers Emitting in the 1310 nm Band"; Semiconductor Science and Technology; 26 (2011) 014016 (6pp); published Nov. 29, 2010.

Spiga, S. et al.; "Single-Mode 1.5-µm VCSEL with 22-GHz Small-Signal Bandwidth"; Proceedings of the European VCSEL day—2016; Darmstadt; Jun. 3, 2016; 3 pages.

Spiga, S. et al.; "Single-Mode 1.5-µm VCSELs with Small-Signal Bandwidth Beyond 20 GHz"; ICTON-2016; paper Mo.D5.3; 2016; pp. 1-4.

United States Patent and Trademark Office, Non-Final Office Action for U.S. Appl. No. 16/589,534, dated Dec. 23, 2020, (30 pages), U.S.

European Search Report from European Patent Application No. 20197767.5, dated Mar. 1, 2021, 12 pages.

Larsson: "Advances in VCSELs for Communication and Sensing", IEEE Journal of Selected Topics in Quantum Electronics, IEEE Service Center, Piscataway, NJ, US; vol. 17, No. 6, Dec. 2011 (Dec. 2011), pp. 1552-1567, XP011459291.

Haglund A et al.: "Single Fundamental-Mode Output Power Exceeding 6mW From VCSELs With a Shallow Surface Relief"; IEEE Photonic Technology Letters, IEEE Service Center, Piscataway, NJ, US; vol. 16, No. 2, Feb. 2004, pp. 368-370, XP002399792.

Finisar Advanced Optical Components Division; "Application Note; Modulating Finisar Oxide VCSELs"; 2007; 8 pages.

Levy J.L. and Mayer R.C.: "Solutions For the Laser Rate Equations For Cavity-Dumping With Pulse Position Modulation"; Mathl. Comput. Modelling, vol. 12, No. 8, pp. 919-923, 1989.

United States Patent and Trademark Office, Final Office Action for U.S. Appl. No. 16/589,534, filed Jun. 8, 2021, (29 pages), U.S.

United States Patent and Trademark Office, Non-Final Office Action for U.S. Appl. No. 16/589,534, filed Aug. 31, 2021, (25 pages), U.S.

\* cited by examiner

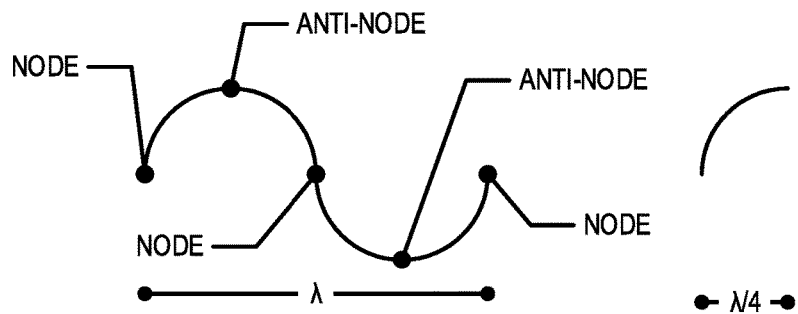
FIG. 2A  FIG. 2B  FIG. 2C
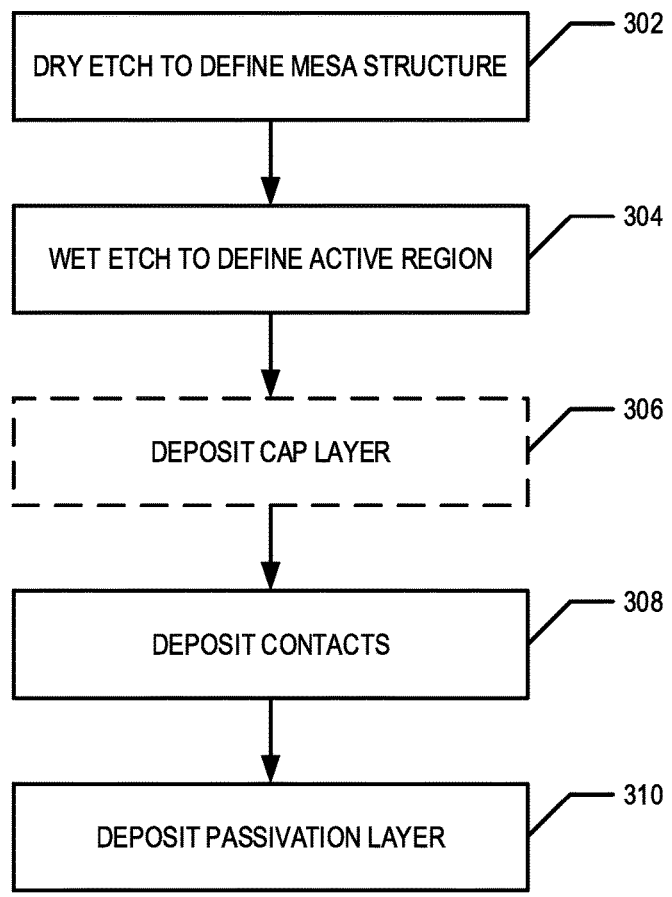
FIG. 3

OPTICALLY MATCHED VERTICAL-CAVITY SURFACE-EMITTING LASER (VCSEL) WITH PASSIVATION

FIELD

Embodiments of the present invention relate generally to vertical-cavity surface-emitting lasers (VCSELs). Example embodiments relate generally to high speed, high bandwidth VCSELs with passivation.

BACKGROUND

As data communication demands increase in both volume and speed, fiber optics have become an increasingly popular communication approach. One emerging element of this approach for generating the data stream communicated through fiber optics cables comprises a VCSEL optically coupled with a single mode fiber. However, traditional VCSEL designs tend to fail to provide control over photon lifetime, signal bandwidth, dumping behavior, and overshoot control for operating as a high speed, high bandwidth VCSEL.

BRIEF SUMMARY OF SOME EXAMPLE EMBODIMENTS

Example embodiments of the present invention provide a high speed, high bandwidth VCSEL. For example, various embodiments provide VCSELs capable of communicating data at rates of 50 gigabytes per second or higher. In an example embodiment, the overshoot of the VCSEL is constrained while providing a controlled photon lifetime, signal bandwidth, and dumping behavior. In an example embodiment, the mesa structure of the VCSEL is sealed via a passivation layer so as to reduce humidity sensitivity of the VCSEL and to protect the mesa structure from contaminants. For example, the passivation layer may protect the VCSEL during use of a dicing saw for separating VCSELS formed on the same wafer.

In an example embodiment, a VCSEL of the present invention comprises an emission structure comprising a first reflector, a second reflector, and an active region sandwiched between the first and second reflectors. In various embodiments, an optical window is defined such that laser light is emitted through the second reflector and through the optical window. In various embodiments, a passivation layer is deposited and/or disposed in the optical window. In an example embodiment, the passivation layer is configured to seal the mesa and protect the mesa from humidity and/or contaminants. In an example embodiment, the passivation layer has a depth of up to approximately $\lambda/2$ with a refractive index correction, where $\lambda$ is the characteristic wavelength of the VCSEL. In an example embodiment, the passivation layer has a depth of $\lambda/4$ with a refractive index correction. The refractive index correction corresponds to the refractive index of the material(s) from which the passivation layer is made. In various embodiments, the passivation layer is configured to maintain high reflectivity of the second reflector, reduce and/or minimize photon lifetime of the VCSEL, and increase and/or maximize the bandwidth of the light emitted by the VCSEL. For example, the passivation layer may be configured to increase control of the dumping behavior and/or overshoot of the VCSEL. In an example embodiment, the passivation layer is configured to cause light exiting the passivation layer to exit at a node or anti-node of the light wave of the emitted light.

According to a first aspect of the present invention, a vertical-cavity surface-emitting laser (VCSEL) is provided. In an example embodiment, the VCSEL comprises a mesa structure disposed on a substrate. The mesa structure comprises a first reflector, a second reflector, and an active cavity material structure disposed between the first and second reflectors. The mesa structure defines an optical window through which the VCSEL is configured to emit light. The mesa structure further comprises a passivation layer disposed at least within the optical window.

In an example embodiment, the passivation layer has a depth of up to $\lambda/2$, wherein the wavelength $\lambda$ is a characteristic wavelength of the VCSEL. In an example embodiment, the depth of the passivation layer is corrected based on a refractive index corresponding to a material of the passivation layer. In an example embodiment, the passivation layer has a depth of up to $\lambda/4$ a refractive index correction determined based on a material of the passivation layer, wherein the wavelength $\lambda$ is a characteristic wavelength of the VCSEL. In an example embodiment, the passivation layer is made of (a) $SiO_2$, (b) $Si_3N_4$, (c) $Al_2O_3$, or (d) any combination of $SiO_2$, $Si_3N_4$, and/or $Al_2O_3$. In an example embodiment, the mesa structure further comprises at least one contact. The at least one contact may be disposed peripheral to the optical window, and the passivation layer may be disposed over a portion of the at least one contact. In an example embodiment, the mesa structure further comprises a cap layer disposed between the second reflector and the at least one contact. In an example embodiment, the passivation layer is configured to reduce the humidity sensitivity of the VCSEL and seal the top of the mesa structure from contaminants. In an example embodiment, the passivation layer is configured to control the node/anti-node output power of light emitted by the VCSEL through the optical window. For example, the passivation layer may be configured to optimize the photon lifetime of the VCSEL, reflectivity of the second reflector, control of dumping behavior, control of overshoot, and/or the like in balance with signal bandwidth. In an example embodiment, the passivation layer is configured to protect at least a portion of the mesa structure during use of a dicing saw on at least a portion of the substrate.

According to another aspect of the present invention, a method for manufacturing a vertical-cavity surface-emitting laser (VCSEL) is provided. In an example embodiment, the method comprises dry etching a VCSEL blank to define a mesa structure disposed on a substrate; wet etching the mesa structure to define an emission structure, the emission structure comprising a first reflector, a second reflector, and an active region sandwiched between the first reflector and the second reflector; and depositing a passivation layer within an optical window of the VCSEL. The VCSEL is configured to emit light through the optical window.

In an example embodiment, the passivation layer is deposited to a depth of up to $\lambda/2$, wherein the wavelength $\lambda$ is a characteristic wavelength of the VCSEL. In an example embodiment, the depth of the passivation layer is corrected based on a refractive index corresponding to a material of the passivation layer. In an example embodiment, the passivation layer is deposited to a depth of up to $\lambda/4$ a refractive index correction determined based on a material of the passivation layer, wherein the wavelength $\lambda$ is a characteristic wavelength of the VCSEL. In an example embodiment, depositing the passivation layer comprises depositing (a) $SiO_2$, (b) $Si_3N_4$, (c) $Al_2O_3$, or (d) any combination of $SiO_2$, $Si_3N_4$, and/or $Al_2O_3$ at least within the optical window. In an example embodiment, the method further comprises depositing at least one contact peripheral to the optical window, wherein the passivation layer is deposited over a portion of the at least one contact. In an example embodiment, the mesa structure further comprises a cap layer disposed between the second reflector and the at least one contact. In an example embodiment, the passivation layer is configured to reduce the humidity sensitivity of the VCSEL and seal the top of the mesa structure from contaminants. In an example embodiment, the passivation layer is configured to control the node/anti-node output power of light emitted by the VCSEL through the optical window. For example, the passivation layer may be configured to optimize the photon lifetime of the VCSEL, reflectivity of the second reflector, control of dumping behavior, control of overshoot, and/or the like in balance with signal bandwidth. In an example embodiment, the passivation layer is configured to protect at least a portion of the mesa structure during use of a dicing saw on at least a portion of the substrate.

BRIEF DESCRIPTION OF THE DRAWING(S)

Having thus described the invention in general terms, reference will now be made to the accompanying drawings, which are not necessarily drawn to scale, and wherein:

FIG. 1 illustrates a schematic cross-section of a VCSEL, according to an example embodiment;

FIGS. 2A, 2B, and 2C provide a representation of a wavelength $\lambda$ of the light emitted from the VCSEL, a quarter of the wavelength $\lambda/4$, and a half of the wavelength $\lambda/2$, respectively; and FIG. 3 provides a flowchart illustrating various processes, procedures, and/or operations for manufacturing a VCSEL according to an example embodiment.

DETAILED DESCRIPTION OF SOME EXAMPLE EMBODIMENTS

The present invention now will be described more fully hereinafter with reference to the accompanying drawings, in which some, but not all embodiments of the inventions are shown. Indeed, these inventions may be embodied in many different forms and should not be construed as limited to the embodiments set forth herein; rather, these embodiments are provided so that this disclosure will satisfy applicable legal requirements. Like numbers refer to like elements throughout. As used herein, terms such as "top," "bottom," "front," etc. are used for explanatory purposes in the examples provided below to describe the relative position of certain components or portions of components. Accordingly, as an example, the term "top current spreading layer" may be used to describe a current spreading layer; however, the current spreading layer may be on the top or on the bottom, depending on the orientation of the particular item being described. As used herein, the term "approximately" refers to tolerances within manufacturing and/or engineering standards.

Example VCSEL

FIG. 1 illustrates a cross section view of a portion of an example embodiment of vertical-cavity surface-emitting laser (VCSEL) 100. The VCSEL 100, comprises a substrate 110, an emission structure, and a cap layer 170. In an example embodiment, a thin buffer layer (e.g., an approximately 0.5 to 1.5 µm thick n-type layer) may be deposited and/or disposed between the substrate 110 and the emission structure. In an example embodiment, the emission structure comprises a first reflector 130, a second reflector 150, and an active cavity material structure sandwiched between the first and second reflectors 130, 150. In an example embodiment, the first reflector 130 is deposited and/or disposed directly on the substrate 110 and/or the thin buffer layer. In an example embodiment, the emission structure forms and/or is part of a mesa structure 115. In an example embodiment, the active cavity material structure comprises a first current-spreading layer 135, an active region 140, and a second current-spreading layer 155. In an example embodiment, the active cavity material structure further comprises a tunnel junction 145 overgrown in the second current-spreading layer 155.

In an example embodiment, the VCSEL 100 further comprises contacts (e.g., comprising trace(s) and/or pad(s) for connecting an electrical source to the VCSEL 100) that are electrically connected to the emission structure (e.g., the first and second current-spreading layers 135, 155). For example, the VCSEL 100 comprises a second contact 180 disposed adjacent to, mounted to, secured to, and/or abutting the cap layer 170 and extending away from the emission structure to provide trace(s) and pad(s) for connecting an electrical source to the VCSEL 100. In an example embodiment, the second contact 180 is in electrical communication with the second current-spreading layer 155 and a first contact (e.g., disposed adjacent to the mesa structure 115, in another mesa structure, and/or the like) is in electrical communication with the first current-spreading layer 135. For example, the first and second contacts 180 may comprise an anode contact and a cathode contact. In various embodiments, the contacts 180 are configured to have leads secured thereto such that the VCSEL 100 may be operated by applying voltage, current, an electrical signal and/or the like to the VCSEL 100 via the leads. In various embodiments, the first and second current-spreading layers 135, 155 are configured to provide electrical signals, current, voltage, and/or the like applied to the contacts 180 to the active region 140. In various embodiments, the first and/or second contacts 180 may be made of gold or another conductive material.

In an example embodiment, the second contact 180 defines an optical window 185 through which the VCSEL 100 is configured to emit laser light 1. In various embodiments, the VCSEL 100 further comprises a passivation layer 190 disposed and/or deposited within the optical window 185. For example, the passivation layer 190 may seal the optical window 185. In an example embodiment, the passivation layer 190 has a depth D that is up to approximately $\lambda/2$ with a refractive index correction, where $\lambda$ is the characteristic wavelength of the VCSEL. In an example embodiment, the passivation layer has a depth of $\lambda/4$ with a refractive index correction. The refractive index correction corresponds to the refractive index of the material(s) of which the passivation layer is made.

In an example embodiment, the substrate 110 provides a base layer upon which the VCSEL is built, mounted, secured, and/or the like. In an example embodiment, the substrate 110 is a semi-insulating gallium arsenide (GaAs) substrate. In various embodiments, the substrate 110 is a GaAs substrate doped with silicon (Si) or various other elements. In another example embodiment, the substrate 110 is a Si substrate, or another appropriate substrate. In an example embodiment, the substrate 110 may be in the range of 50 to 300 µm thick. For example, the substrate 110 may be approximately 150 µm thick, in an example embodiment. In an example embodiment, the substrate 110 is at least a portion of a wafer.

In various embodiments, the emission structure of the VCSEL 100 comprises a first reflector 130, a first current-spreading layer 135, an active region 140, a second current-spreading layer 155, and a second reflector 150. The first reflector 130 may be adjacent, secured, mounted to and/or abutting the substrate 110 and/or the thin buffer layer. The first current-spreading layer 135 may be a current spreading and/or conductive layer sandwiched between the first reflector 130 and the active region 140. For example, the first current-spreading layer 135 may be adjacent, secured, mounted to and/or abutting the first reflector 130 and the active region 140. The second current-spreading layer 155 may be a current spreading and/or conductive layer sandwiched between the active region 140 and the second reflector 150. For example, the second current-spreading layer 155 may be adjacent, secured, mounted to and/or abutting the active region 140 and the second reflector 150.

In various embodiments, the first and second reflectors 130, 150 are configured to couple and/or reflect laser light generated by the active region 140 such that the laser light 1 may be emitted through the aperture of aperture diameter $a_c$ in the contact 180 in a direction along the emission axis 105. In various embodiments, each of the first and second reflectors 130, 150 comprises a semiconductor distributed Bragg reflector (DBR), dielectric reflector stacks, and/or the like. For example, the first and second reflectors 130, 150 may comprise un-doped alternating layers of aluminum gallium arsenide (AlGaAs) and gallium arsenide (GaAs). In various embodiments, each of the first and second reflectors 130, 150 may comprise a plurality of layers of AlGaAs and GaAs. For example, each of the first and second reflectors 130, 150 may comprise between 15 and 35 pairs of layers of GaAs/AlGaAs. For example, in some embodiments, each of the first and second reflectors may comprise 25 pairs of layers of GaAs/AlGaAs. For example, each of the first and second reflectors may comprise 25 layers of GaAs and 25 layers of AlGaAs wherein the layers are disposed such that the layers alternate between a GaAs layer and an AlGaAs. For example, a pair of layers may consist of a GaAs layer and an abutting AlGaAs layer. In an example embodiment, the thickness of each layer is approximately one-fourth $\lambda/n$, where $\lambda$ is the emission wavelength and n is the refractive index of the semiconductor of that layer. In an example embodiment, at least one layer of the first reflector 130 is doped such that the first reflector comprises an n-type DBR (N-DBR). In an example embodiment, at least one layer of the second reflector 150 is doped such that the second reflector comprises a p-type DBR (P-DBR). In an example embodiment, the second reflector 150 is partially oxidized and/or comprises one or more oxidized elements 160 that define an oxidation profile.

As described above, a first current-spreading layer 135 may be sandwiched between the first reflector 130 and the active region 140, and a second current-spreading layer 155 may be sandwiched between the active region 140 and the second reflector 150. In various embodiments, the first and second current-spreading layers 135, 155 comprise n-type indium phosphide (n-InP) layers. In various embodiments, the first and/or second current-spreading layer 135, 155 comprises an indium gallium arsenide phosphide (InGaAsP) layer. In various embodiments, providing the electrical contact through n-type first and second current-spreading layers 135, 155 allows for each of the first and second reflectors 135, 155 to comprise un-doped DBR mirrors or dielectric reflector stacks, as described elsewhere herein.

In various embodiments, the active region 140 comprises a tunnel junction 145 that is embedded and/or disposed within the second current-spreading layer 155. For example, the tunnel junction 145 may be overgrown by the second current spreading layer 155, wherein the tunnel junction 145 is disposed adjacent and/or abutting the active region 140. In an example embodiment, the tunnel junction 145 is a mesa etched in the $p^{++}/n^{++}$ tunnel junction. In an example embodiment, the tunnel junction 145 comprises a heavily doped p++/n++ indium aluminum gallium arsenide tunnel junction. In various embodiments, a reverse biased p-n junction blocks the current around the tunnel junction 145 when a direct voltage is applied to the VCSEL 100 (e.g., via the contacts 180). In various embodiments, the tunnel junction 145 serves a dual role of optical (photon) and electrical (current) confinement. The tunnel junction 145 may, for example, be embedded in an overgrown region which provides both current and photon confinement. In this example, the current is confined by the reverse p-n junction that is formed at the interface between the second current-spreading layer 155 and a p-layer comprising a second surface 144 of the active region 140. In an example embodiment, optical confinement is defined by the tunnel junction 145 representing an optical aperture for emitting laser light 1 and is determined by the width or diameter of the tunnel junction 145 (e.g., the tunnel junction diameter $D_{TJ}$) in a plane perpendicular to the emission axis 105.

In various embodiments, the active region 140 is sandwiched and/or disposed between the first and second current-spreading layers 135, 155. In various embodiments, the active region 140 is in electrical communication with the first and second current-spreading layers 135, 155. In various embodiments, the active region 140 comprises a plurality of quantum wells, where light and/or electromagnetic radiation 1 is generated, between the first and second reflectors 130, 150. In various embodiments, the active region 140 may comprise a multi-quantum well (MQW) layer stack comprising a series of quantum wells disposed between a series of barriers, a p-type region (layer) disposed between the second current-spreading layer 155 and the MQW layer stack. For example, a second surface 144 of the active region 140 may comprise a p-type layer. In an example embodiment, the series of quantum wells and barriers may comprise six un-doped compressively strained, indium aluminum gallium arsenide (InAlGaAs) quantum wells and seven tensile strained InAlGaAs barriers.

In an example embodiment, a cap layer 170 is deposited and/or disposed on the emission structure. The cap layer 170 may be an insulating layer made of and/or comprising $SiO_2$, $Si_3N_4$, benzo-cyclo-butene (BCB), and/or the like, for example. In an example embodiment, the cap layer 170 is approximately 40 nm thick.

In various embodiments, the VCSEL 100 further comprises a passivation layer 190. In various embodiments, the passivation layer 190 is made of $SiO_2$, $Si_3N_4$, $Al_2O_3$, any combination thereof, and/or any other material or combination of materials having an appropriate transparency at the wavelength $\lambda$ and/or a wavelength band comprising the wavelength $\lambda$. The wavelength $\lambda$ is the characteristic wavelength of the VCSEL 100. In an example embodiment, the passivation layer 190 has a depth D of up to approximately $\lambda/2$, where $\lambda$ is the characteristic wavelength of the VCSEL 100. In an example embodiment, the passivation layer 190 has a depth D of up to approximately $\lambda/2$, with a refractive index correction. In an example embodiment, the passivation layer 190 has a depth D of $\lambda/4$ with a refractive index correction. FIG. 2A illustrates an example wavelength $\lambda$, FIG. 2B illustrates $\lambda/4$, and FIG. 2C illustrates $\lambda/2$. The refractive index correction may correspond to the refractive index of the material(s) of which the passivation layer 190 is made. For example, if the characteristic wavelength of the VCSEL 100 is wavelength $\lambda=850$ nm and the passivation layer 190 is made of $Si_3N_4$, which has a refractive index of n=2 at 850 nm, the depth D of the passivation layer 190 is 106.25 nm, in an example embodiment where the passivation layer 190 has a depth D of $\lambda/4$ with a refractive index correction. In various embodiments, the depth D of the passivation layer 190 is measured parallel to the emission axis 105.

According to various embodiments, the passivation layer 190 acts to enclose and/or seal the mesa structure 115. For example, the passivation layer 190 may reduce the humidity sensitivity and protect the mesa structure 115 from contamination, in various embodiments. In various embodiments, the depth D of the passivation layer 190 controls the node/anti-node output power of the light 1. For example, the depth D of the passivation layer 190 may be configured to control photon lifetime, reflectivity optimization, dumping behavior, overshoot, and signal bandwidth of the VCSEL 100. In various embodiments, the passivation layer is configured to protect the VCSEL 100 during use of a dicing saw for separating VCSELS formed on the same wafer, for example. For example, the passivation layer 190 may enable the use of a dicing saw with respect to the VCSEL 100 and/or substrate 110. Thus, the passivation layer 190 having a depth D may provide an improvement in overshoot control, broader modulation bandwidth, and faster pulsing of the VCSEL 100 such that the VCSEL 100 may provide a high speed, high bandwidth signal with controlled overshoot.

Example Method for Manufacturing a VCSEL

FIG. 3 provides a flowchart illustrating an example process for manufacturing a VCSEL 100 according to embodiments described herein. Starting at block 302, a VCSEL blank comprising a plurality of layers may be dry-etched to define one or more mesas (e.g., mesa structure 115). For example, the VCSEL blank may be formed on the substrate 110 (and/or thin buffer layer) and may comprise a first layer from which a first reflector 130 may be formed, a second layer from which a first current-spreading layer 135 may be formed, a third layer from which an active region 140 may be formed, a fourth layer from which a second current-spreading layer 155 may be formed, a fifth layer from which second reflector 150 may be formed, and/or the like. In an example embodiment, the VCSEL blank comprises a sixth layer from which a cap layer 170 may be formed. For example, the first and fifth layers may comprise a plurality of un-doped alternating layers of AlGaAs and GaAs for forming DBR mirrors of the first and second reflectors 130, 150. In an example embodiment, the second and fourth layers comprise a conductive material from which the first and second current-spreading layers 135, 155 may be formed. In an example embodiment, the fourth layer of the VCSEL blank may have a tunnel junction 145 embedded, disposed, and/or grown therein. For example, the third layer may comprise a multi-quantum well (MQW) layer stack comprising a series of quantum wells disposed between a series of barriers. In an example embodiment, the third layer comprises a p-type region (layer) disposed between the MQW layer stack and the fourth layer of the VCSEL blank.

The VCSEL blank may be dry etched to form and/or define one or more mesas (e.g., mesa structure 115). In an example embodiment, the VCSEL blank is dry etched in $Ar$—$SiCl_4$ plasma. In an example embodiment, the VCSEL blank is dry etched using a photoresist or dielectric mask. In an example embodiment, the center of the masked region is aligned with the center of the tunnel junction 145. In an example embodiment, the dry etching is used to define the second reflector 150. In an example embodiment, the dry-etching is ceased when the second layer (e.g., the layer from which the first current-spreading layer may be formed) is exposed.

Continuing with FIG. 3, at block 304 wet etching may be used to define and/or form the active region 140 and the second reflector 150. For example, in an example embodiment, the wet etching is done by selective chemical etching in $H3PO4$-$H2O2$-$H2O$ solutions until the first current-spreading layer 135 is reached. For example, the mesa structure 115 may be wet etched to define and/or to finish defining the emission structure. For example, the first reflector 130 may have a diameter that is larger than the remainder of the mesa structure 115 and the first current-spreading layer 135 may have a diameter that is approximately the same size as the first reflector 130 or smaller and that is larger than the remainder of the mesa structure 115. For example, the diameter of the first current-spreading layer 135 may be configured to allow for electrical contacts to be generated between the first current-spreading layer 135 and first contacts configured to provide an electrical signal to the first current-spreading layer 135.

At block 306, the cap layer 170 may be deposited onto the second reflector 150. For example, if the VCSEL blank does not include a layer from which the cap layer 170 is to be formed, the cap layer 170 may be deposited onto the second reflector 150. For example, chemical vapor deposition may be used to deposit the material of the cap layer 170. The cap layer 170 may be an insulating layer made of and/or comprising $SiO_2$, $Si_3N_4$, benzo-cyclo-butene (BCB), and/or the like, for example. In an example embodiment, the material of the cap layer 170 may be deposited to a thickness of approximately 40 nm.

At block 308, the second contacts 180 may be deposited and/or formed on the cap layer 170. For example, various metal deposition techniques may be used to deposit the second contacts 180 on the cap layer 170. In an example embodiment, the second contacts 180 are deposited around the optical window 185. In an example embodiment, the second contacts 180 are deposited and/or formed such that the second contacts 180 are in directed electrical communication with the second current-spreading layer 155.

At block 310, the passivation layer 190 is deposited onto the second contact 180 and/or cap layer 170. For example, the passivation layer 190 may be deposited within the optical window 185. For example, the passivation layer 190 may be deposited within the optical window 185 so as to seal the mesa structure 115 from humidity and/or contamination. For example, $SiO_2$, $Si_3N_4$, $Al_2O_3$, any combination thereof, and/or any other material or combination of materials having an appropriate transparency at the wavelength $\lambda$ and/or a wavelength band comprising the wavelength $\lambda$ may be deposited (possibly in multiple layers) within the optical window 185, on the cap layer 170, and/or on at least a portion of the second contact 180. In an example embodiment, the material(s) of the passivation layer 190 may be deposited to a depth D of up to approximately $\lambda/2$, where $\lambda$ is the characteristic wavelength of the VCSEL 100. In an example embodiment, the material(s) of the passivation layer 190 may be deposited to a depth D of up to approximately $\lambda/2$, with a refractive index correction. In an example embodiment, the material(s) of the passivation layer 190 may be deposited to a depth D of $\lambda/4$ with a refractive index correction. The refractive index correction corresponds to the refractive index of the material(s) of which the passivation layer 190 is made.

As should be understood, once a VCSEL 100 has been formed, manufactured, and/or the like, the VCSEL may be secured, affixed, or otherwise mounted to a circuit board. For example, a VCSEL 100 may be secured, affixed, and/or mounted to a circuit board such that the first contact is mechanically secured to a first lead such that the first contact is in electrical communication with the first lead. For example, a VCSEL 100 may be secured, affixed, and/or mounted to a circuit board such that the second contact 180 is mechanically secured to a second lead such that the second contact 180 is in electrical communication with the second lead. Mounting a VCSEL 100 to a circuit board may therefore manufacture, generate, form, and/or the like a board-mounted VCSEL.

CONCLUSION

Many modifications and other embodiments of the inventions set forth herein will come to mind to one skilled in the art to which these inventions pertain having the benefit of the teachings presented in the foregoing descriptions and the associated drawings. Therefore, it is to be understood that the inventions are not to be limited to the specific embodiments disclosed and that modifications and other embodiments are intended to be included within the scope of the appended claims. Although specific terms are employed herein, they are used in a generic and descriptive sense only and not for purposes of limitation.

That which is claimed:

1. A vertical-cavity surface-emitting laser (VCSEL) comprising:
    a mesa structure disposed on a substrate, the mesa structure comprising:
        a first reflector,
        a second reflector, and
        an active cavity material structure disposed between the first and second reflectors, wherein the mesa structure defines an optical window through which the VCSEL is configured to emit light; and
    the mesa structure further comprises a passivation layer disposed at least within the optical window and exterior to a cavity defined by the first and second reflectors, wherein:
        the passivation layer is configured to (a) cause light exiting the passivation layer to exit at a node or anti-node of the light wave of the emitted light and (b) seal the optical window,
        a node/anti-node output power of light emitted by the VCSEL through the optical window corresponds to a depth of the passivation layer, and
        the passivation layer comprises at least one of (a) a nitride or (b) an oxide.

2. The VCSEL of claim 1, wherein the passivation layer has a depth of up to $\lambda/2$, wherein $\lambda$, is a characteristic wavelength of the VCSEL.

3. The VCSEL of claim 2, wherein the depth of the passivation layer is corrected based on a refractive index corresponding to a material of the passivation layer.

4. The VCSEL of claim 1, wherein the passivation layer has a depth of up to $\lambda/4$ taking into account a refractive index correction determined based on a material of the passivation layer, wherein $\lambda$, is a characteristic wavelength of the VCSEL.

5. The VCSEL of claim 1, wherein the at least one of (a) a nitride or (b) an oxide comprises (a) $SiO_2$, (b) $Si_3N_4$, (c) $Al_2O_3$, or (d) a combination of $SiO_2$, $Si_3N_4$, and/or $Al_2O_3$.

6. The VCSEL of claim 1, wherein the mesa structure further comprises at least one contact, the at least one contact disposed peripheral to the optical window, and the passivation layer is disposed over a portion of the at least one contact.

7. The VCSEL of claim 6, wherein the mesa structure further comprises a cap layer disposed between the second reflector and the at least one contact.

8. The VCSEL of claim 1, wherein the passivation layer is configured to reduce the humidity sensitivity of the VCSEL and seal the top of the mesa structure from contaminants.

9. The VCSEL of claim 1, wherein the passivation layer is configured to control at least one of photon lifetime, reflectivity optimization, dumping behavior, overshoot, or signal bandwidth of light emitted by the VSCEL.

10. The VCSEL of claim 1, wherein the passivation layer is configured to protect at least a portion of the mesa structure during use of a dicing saw on at least a portion of the substrate.

11. A method for manufacturing a vertical-cavity surface-emitting laser (VCSEL), the method comprising:
    dry etching a VCSEL blank to define a mesa structure disposed on a substrate;
    wet etching the mesa structure to define an emission structure, the emission structure comprising a first reflector, a second reflector, and an active region sandwiched between the first reflector and the second reflector; and
    depositing a passivation layer within an optical window of the VCSEL and exterior to a cavity defined by the first and second reflectors light such that the passivation layer seals the optical window, wherein:
    the passivation layer is configured to cause light exiting the passivation layer to exit at a node or anti-node of the light wave of the emitted light, a node/anti-node output power of light emitted by the VCSEL through the optical window corresponds to a depth of the passivation layer, and the passivation layer comprises at least one of (a) a nitride or (b) an oxide.

12. The method of claim 11, wherein the passivation layer is deposited to a depth of up to $\lambda/2$, wherein $\lambda$, is a characteristic wavelength of the VCSEL.

13. The method of claim 12, wherein the depth of the passivation layer is corrected based on a refractive index corresponding to a material of the passivation layer.

14. The method of claim 11, wherein the passivation layer is deposited to a depth of up to $\lambda/4$ with a refractive index correction determined based on a material of the passivation layer, wherein $\lambda$, is a characteristic wavelength of the VCSEL.

15. The method of claim 11, wherein the at least one of (a) a nitride or (b) an oxide comprises (a) $SiO_2$, (b) $Si_3N_4$, (c) $Al_2O_3$, or (d) a combination of $SiO_2$, $Si_3N_4$, and/or $Al_2O_3$.

16. The method of claim 11, further comprising depositing at least one contact peripheral to the optical window, wherein the passivation layer is deposited over a portion of the at least one contact.

17. The method of claim 16, wherein the mesa structure further comprises a cap layer disposed between the second reflector and the at least one contact.

18. The method of claim 11, wherein the passivation layer is configured to reduce the humidity sensitivity of the VCSEL and seal the top of the mesa structure from contaminants.

19. The method of claim 11, wherein the passivation layer is configured to control at least one of photon lifetime, reflectivity optimization, dumping behavior, overshoot, or signal bandwidth of light emitted by the VSCEL.

20. The method of claim 11, wherein the passivation layer is configured to protect at least a portion of the mesa structure during use of a dicing saw on at least a portion of the substrate.

* * * * *